United States Patent [19]

Carlson

[11] Patent Number: 4,857,846

[45] Date of Patent: Aug. 15, 1989

[54] RAPID MRI USING MULTIPLE RECEIVERS PRODUCING MULTIPLY PHASE-ENCODED DATA DERIVED FROM A SINGLE NMR RESPONSE

[75] Inventor: Joseph W. Carlson, San Francisco, Calif.

[73] Assignee: The Regents of the University of California, Oakland, Calif.

[21] Appl. No.: 176,251

[22] Filed: Mar. 31, 1988

[51] Int. Cl.⁴ .......................................... G01R 33/20
[52] U.S. Cl. .................................... 324/309; 324/314
[58] Field of Search ................... 364/324.05; 324/300, 324/307, 309, 311, 312, 314, 313

[56] References Cited

U.S. PATENT DOCUMENTS

| | | | |
|---|---|---|---|
| 4,418,316 | 11/1983 | Young et al. | 324/309 |
| 4,598,368 | 7/1986 | Umemura | 364/324.05 |
| 4,611,172 | 9/1986 | Takase | 324/314 |
| 4,616,181 | 10/1986 | Kemner | 324/309 |
| 4,652,827 | 3/1987 | Eguchi | 324/312 |
| 4,668,915 | 5/1987 | Daubin et al. | 324/309 |
| 4,682,112 | 6/1987 | Beer . | |
| 4,719,581 | 1/1988 | Sakamoto | 324/307 |
| 4,727,327 | 2/1988 | Toyoshima et al. | 324/309 |
| 4,746,865 | 5/1988 | Kasugai | 324/309 |

OTHER PUBLICATIONS

Hutchinson et al, "Fast MRI Data Acquisition Using Multiple Detectors," Mag. Res. Med. 6, 87–91 (1988).
Kumar A., Welti D. and Ernst R. R., NMR Fourier Zeugmatography, Journal of Magnetic Resonance, 1975; 18:69–83.
Sutherland R. J. and Hutchinson J. M. S., Three-Dimensional NMR Imaging Using Selective Excitation, Journal of Physics E 1978; 11:79–83.
Lauterbur P. C., Image Formation by Induced Local Interactions: Examples Employing Nuclear Magnetic Resonance, Nature 1973; 16:242–243.
den Boef F. H., van Uijen C. M. T. and Holzscherer C. D., Multiple-Slice NMR Imaging by Three-Dimensional Fourier Zeugmatography, Physics in Medicine and Biology 1984; 29:857–867.
Feinberg D. A., Hale J. D., Watts J. D., Kaufman L. and Mark A., Halving ME Imaging Time by Conjunction: Demonstration at 3.5KG, Radiology 1986; 161:527–531.
Ernst R. R., Sensitivity Enhancement in Magnetic Resonance in: Waugh J. S., ed., Advances in Magnetic Resonance, vol. 2, N.Y.: Academic Press, 1966: 1–135.
Carlson J., Crooks L. E., Ortendahl D. A., Kramer D. M. and Kaufman L., Technical Note: Comparing S/N and Section Thickness in 2-D and 3-DFT MRI, Radiology 1988; 166:266–270.

Primary Examiner—Michael J. Tokar
Attorney, Agent, or Firm—Nixon & Vanderhye

[57] ABSTRACT

Method and apparatus for more rapidly capturing MRI data by receiving and recording NMR RF responses in plural substantially independent RF signal receiving and processing channels during the occurrence of an NMR RF response. The resulting plural data sets respectively provided by the plural RF channels are then used to produce multiply phase-encoded MRI data from the single NMR RF response. Practical examples are disclosed for reducing required MRI data capturing time by factors of at least about one-half.

23 Claims, 6 Drawing Sheets

TWO-COIL RECONSTRUCTION OF POINT SAMPLE
THREE PROJECTIONS PER ECHO

FIG. 8

TWO-COIL RECONSTRUCTION OF POINT SAMPLE
TWO PROJECTIONS PER ECHO

FIG. 9

TWO-COIL RECONSTRUCTION OF POINT SAMPLE
AVERAGED TWO PROJECTIONS PER ECHO

STANDARD RECONSTRUCTION WITH NOISE

FIG. 12

TWO-COIL RECONSTRUCTION WITH NOISE

RAPID MRI USING MULTIPLE RECEIVERS PRODUCING MULTIPLY PHASE-ENCODED DATA DERIVED FROM A SINGLE NMR RESPONSE

This invention is generally related to magnetic resonance imaging (MRI) using nuclear magnetic resonance (NMR) phenomena. It is particularly directed to method and apparatus for more efficiently capturing and providing MRI data suitable for use in multi-dimensional Fourier transformation MRI imaging processes.

MRI is by now a widely accepted and commercially viable technique for obtaining digitized video images representative of internal body structures. There are many commercially available approaches and there have been numerous publications describing these and other approaches to MRI. Many of these use multi-dimensional Fourier transformation techniques which are, by now, well-known to those skilled in this art.

For example, in one commercially available MRI system, a slice selective $G_z$ magnetic gradient pulse is utilized in conjunction with RF nutation pulses (including a 180° nutation pulse) to produce true spin echo NMR RF pulses from only a relatively narrow "planar" or "slice" volume perpendicular to the Z axis. During readout and recordation of the NMR spin echo RF response, a $G_x$ magnetic gradient pulse is employed to provide spatially dependent frequency/phase-encoding in the X axis dimension. Accordingly, by a first one-dimensional Fourier Transformation process, one can obtain Fourier coefficients representing the NMR spin echo response at different X locations emanating from a correspondingly located "column" volumes parallel to the Y axis. By rapidly repeating this same process using different slice selective $G_z$ gradient pulses during a single T1 NMR interval, it is known that one can significantly enhance the efficiency of obtaining data for a number of planar volumes (sometimes called "multi-slice" MRI).

However, one cannot produce the requisite two-dimensional visual image from only a single dimension of Fourier transformation (per slice) as just described. To obtain the second dimension of Fourier coefficients for resolution in the Y axis dimension, a different $G_y$ phase-encoding pulse (e.g., different in magnitude and/or time duration) is utilized during the NMR excitation process such that the NMR spin echo responses during different data gathering cycles will produce Fourier coefficients phase-encoded with respect to spatial location in the Y axis dimension.

Accordingly, if one wants to obtain, for example, a resolution of 256 pixels along the Y axis dimension, then one must go through 256 data gathering cycles (per slice) with correspondingly different Y axis phase-encoding in each cycle to assemble the requisite data required for the second dimension of Fourier transformation.

Because the normally encountered T1 NMR parameter is on the order of a second or so in many human tissues, and because one typically does not (in this exemplary system) repeat a data taking cycle within the same volume until the previous NMR nuclei have substantially returned to their quiescent conditions, it will be appreciated that the need to repeat a data taking cycle literally hundreds of times translates into an overall MRI data capturing process that requires several minutes to complete. And some of the more interesting future MRI applications may even require thousands of data taking cycles and several tens of minutes using current technology. At the same time, as is well known in the art, MRI systems, facilities and operating personnel represent a significant expense which can only be economic if the time required for capturing NMR data per patient is minimized.

In addition to the rather basic economic improvement that can be obtained by reducing MRI data capture time, it may also make practical some rather sophisticated new MRI possibilities. For example, three dimensional MRI may be useful for permitting one to obtain oblique reconstruction images on any desired (oblique) plane. For this application, one should use isotropic resolution which implies the creation of an MRI data set having 256 voxels (volume picture elements) in each of three mutually orthogonally dimensions. Even if partial flip imaging techniques are used to minimize intervals between NMR excitation sequences, current MRI techniques might still require imaging times on the order of a half hour—which is probably beyond a reasonable imaging time for most patients. If this time requirement could be reduced by at least a factor of one-half, it might become a much more attractive possibility.

Similarly, echo planar imaging techniques (which permit all data required for a single image to be obtained after a single excitation) would become more practical if higher resolution data could be obtained during the ensuing train of NMR RF responses (which is necessarily limited by the T2 decay parameter).

The enhanced diagnostic possibilities that may someday be provided by spectroscopic MRI imaging might also become more practical if some technique is developed for shortening the time required to collect requisite spectroscopic imaging data. MRI angiography is another technique which presently requires unusually long MRI imaging times and which may become considerably more practical if a reduced imaging time technique could be employed.

Furthermore, it is perhaps self-evident that motion artifact can be reduced if one can somehow shorten the time interval over which requisite MRI data is collected.

In short, standard techniques of two-dimensional Fourier transform magnetic resonance imaging are already highly efficient in two out of three dimensions. Through the use of selective excitation and data acquisition with a readout gradient, the Fourier transform of the acquired data effectively localizes signal in two dimensions. However, there remains a time consuming aspect of MRI insofar as it is still necessary to obtain multiple phase-encoded data acquisitions to localize the signal in the third (Y axis) dimension in many standard MRI processes.

The need for reducing MRI image time requirements has been recognized by many others. There are other techniques for more rapidly obtaining requisite MRI data. For example, other techniques for rapid MRI imaging have attempted to reduce the time spent on acquiring phase-encoded acquisitions. For example, data conjugation techniques (exploiting the symmetries of the Fourier transform) are already employed in some commercial processes to reduce the number of required acquisitions by a factor of two. Partial flip angle nutation (instead of a full 90° initial RF nutation angle) may also be employed to eliminate signal loss normally encountered with rapid acquisitions (e.g., as in short repetition time techniques). In principle, the most efficient means of signal acquisition for MRI may involve the use of only partial initial RF nutation angles or "partial flip" combined with a very short TR interval between repetitions of the NMR excitation-response processes used in the data gathering phase of MRI. For example, this latter partial flip technique has aided in the development of three dimensional Fourier transform techniques for imaging a large number of sections within a very short TR.

Some publications generally relevant to such MRI techniques as have just been discussed may be noted as follows:

Kumar A., Welti D. and Ernst R. R. NMR Fourier Zeugmatography. Journal of Mangetic Resonance 1975; 18:69–83.

Sutherland R. J. and Hutchison J. M. S. Three-Dimensional NMR Imaging Using Selective Excitation. Journal of Physics E 1978; 11:79–83.

Lauterbur P. C. Image Formation By Induced Local Interactions: Examples Employing Nuclear Magnetic Resonance Nature 1973; 16:242–243.

den Boef J. H., van Vijen C. M. T. and Holzscherer C. D. Multiple-Slice NMR Imaging by Three-Dimensional Fourier Zeugmatography. Physics in Medicine and Biology 1984; 29:857–867.

Feinberg D. A., Hale J. D., Watts J. C. Kaufman L. and

Mark A. Halving MR Imaging Time By Conjugation: Demonstration at 3.5KG. Radiology 1986; 161:527–531.

Ernst R. R. Sensitivity Enhancement in Mangetic Resonance In: Waugh J. S., ed. Advances in Mangetic Resonance Vol. 2, N.Y.: Academic Press, 1966:1–135.

Carlson J., Crooks L. E., Ortendahl D. A., Kramer D. M. and Kaufman L. Technical Note: Comparing S/N and Section Thickness in 2-D and 3-DFT MRI. Radiology 1988;166:266–270

I have discovered a new MRI reconstruction algorithm which permits a reduction in the number of required phase-encoding data acquisitions in an MRI imaging sequence without reducing either resolution or field of view. One principle of this technique involves the use of two (or more) non-interacting receiver coils (and corresponding independent RF receiving and signal processing channels) so as to each simultaneously detect an NMR response signal from the same tissue. An imaging sequence may use phase-encoded spin echoes or gradient echoes in the usual way; however, the reconstruction algorithm effectively calculates multiple Fourier projections of the tissue from but a single NMR response (e.g., a spin echo).

A full implementation of this discovery using but two receiver coils (and associated RF signal processing channels) can reduce the number of needed phase-encoded data acquisitions by 50% as compared to the fewest number otherwise (e.g,. previously) required.

In essence, my new technique is a variation of standard two-dimensional or three-dimensional MRI but, instead of using a single RF receiver coil and its associated RF signal processing channel, I use at least two (or more) different non-interacting receiver coils and associated RF signal processing channels to simultaneously detect an NMR response signal emanating from a given tissue. The coils are constructed and/or oriented so that their respective responses to the same NMR signal are different—i.e., the coil responses respectively depend upon the relative spatial location of the nuclei emitting the NMR RF response. This added spatial dependency provides additional information from the same single NMR RF response which can be effectively used to reduce the number of NMR data acquisition cycles required for a given resolution of MRI image reconstruction. In short, the MRI reconstruction algorithm is permitted to calculate multiple Fourier projections from but a single NMR RF response (e.g., a single spin echo) resulting in a significant time savings in required MRI data acquisition time.

Some aspects of my invention have already been published ("An Algorithm for NMR Imaging Reconstruction Based on Multiple RF Receiver Coils," Journal of Magnetic Resonance J. Mag. Res., Vol 74, pp 376–380, 1987). And others, subsequent to my invention, have now proposed the general concept of using multiple detectors for MRI data acquisition so as to save data acquisition time—but without any apparent practical implementations in mind (see Hutchinson et al, "Fast MRI Data Acquisition Using Multiple Detectors," Magnetic Resonance in Medicine, Vol. 6, 1988, pp 87–91).

This invention is especially useful in MRI data capturing sequences where a dimension transverse to the static magnetic field is phase-encoded over a plurality of data gathering sequences to obtain requisite MRI data for a single image. It may be used with both two and three-dimensional Fourier Transform Magnetic Resonance Imaging processes. Preferably, in the exemplary embodiments, the static magnetic field is horizontal (as in a super conducting solenoidal magnet) so that the exemplary RF receiving coils permit the most convenient patient access.

In this invention, a system of multiple RF receiving coils provides some localization of NMR RF signal responses in at least the phase-encoded dimensions. By using spatial dependence of the phase (primarily) and the amplitude (secondarily) of the NMR RF response signal induced in a set of non-interacting RF receive coils, it is possible to calculate multiple phase-encoded signals from but a single NMR RF response (e.g., a single NMR spin echo response). This technique is compatible with existing two and three dimensional imaging techniques and may also find use in conjunction with other rapid MRI imaging techniques. The exemplary embodiments provide for a reduction in the required minimum number of NMR RF responses by a factor of at least about two.

It is worth noting some specific imaging protocols to which this rapid technique may be applied. These examples are not intended to be comprehensive, but rather, protocols chosen to illustrate sequences which are presently limited by the number of necessary phase-encoded acquisitions:

(1) 3D partial flip imaging can achieve a realistic minimum TR of approximately 50 msec. Below this value data acquisition time, i.e., echo length, must be decreased, resulting in an increased bandwidth with a consequent increase in noise. One promising utility of 3D MRI is oblique reconstruction to form images on any plane. For this one should use isotropic resolution which would imply a high resolution data set of $256^3$ voxels. Using a 50 msec TR, this gives a minimum imaging time of 55 minutes. Data conjugation may reduce this to 27 minutes, but this is still beyond reasonable imaging time for most patients. A reduction to 14 minutes through the use of multiple receivers makes this an attractive possibility.

(2) Echo planar imaging collects all data for a single image after one excitation. Data acquisition time is therefore limited by T2 of the tissue. Presently resolution is limited by the number of projections available within this time. One laboratory's limitation on resolution is 128 phase-encoded projections. Multiple receiver coil reconstruction will allow for higher resolution (e.g., 256 projection) echo planar imaging.

(3) Short TR partial flip imaging has been seen to be inappropriate for some imaging protocols. Tissue contrast generally decreases in short TR partial flip images, which can be a disadvantage in some diagnoses. Metallic implants and magnetic field inhomogeneities give rise to artifacts that further degrade the images. (Since it relies on gradient echoes, 2D partial flip MRI is much more susceptible to these artifacts.) Multiple receiver coil reconstruction may allow for new flexibility in protocols which manipulate image contrast in rapid scan.

Further expansion of the ability of MRI to serve clinical needs relies on reduction of imaging time. This new approach towards rapid MRI can be used with existing methods and can further reduce imaging time. Other possible applications involve imaging times longer than those of standard MRI. For example, spectroscopic imaging is hindered in patient acceptance by the very long imaging times required. A reduction by 50% in imaging time can certainly improve its clinical usefulness. MRI angiography generally requires two to four times the usual imaging time. In this case, a reduction in time will aid not only in acceptance, but also in improving the image registration by reducing patient motion during the scan time. Motion artifacts produced by respiratory motion decrease with signal averaging. Thus, multiple coil image reconstruction may be used as a way to reduce artifacts in a fixed imaging time. Multiple coil reconstruction will add to the flexibility of implementing many MRI procedures.

These examples are described to illustrate how a reduction in phase-encoded data acquisition time can provide new possibilities in imaging protocols. A distinct use of this reconstruction is as a technique that increases the number of data set acquisitions effected in the same amount of time. While this will probably not result in an improvement in the signal to noise ratio, it may be useful in reducing motion artifacts. A discussion of signal to noise in the exemplary embodiment will be presented later.

Further improvements can be had by adding additional receiver coils. In general one may consider a set of N receivers. Using the exemplary reconstruction algorithm, one may then calculate N phase encoded projections per echo. Introducing more receiver coils adds to the technical difficulty of implementation due to the necessity of maintaining electrical isolation between the receiving coils.

In one exemplary embodiment, a pair of essentially co-located "birdcage" coils is utilized. One of the coils is tuned to a fundamental frequency corresponding to the desired NMR frequency band (e.g., about 15 MHz) while the second coil is tuned so that its second harmonic is at the same frequency (e.g., about 15 MHz). As will be shown in more detail below, this results in the requisite current/voltage distribution on the axially extending coil wires to take on the form of $\sin \theta$ and $\sin 2\theta$, respectively, where $\theta$ is a relative wire location angle in the x,y plane. Standard MRI RF coil construction techniques are used to minimize mutual inductance or capacitive coupling between the two coils so as to keep them substantially independent of one another. Saddle coil constructions may also be utilized to obtain the requisite respective $\sin \theta \ldots \sin N\theta$ current/voltage distributions in the N receiving coils.

These as well as other objects and advantages of this invention will be more completely understood and appreciated by carefully reading the following detailed description of the presently preferred exemplary embodiments in conjunction with the attached drawings, of which.

Figure 1:
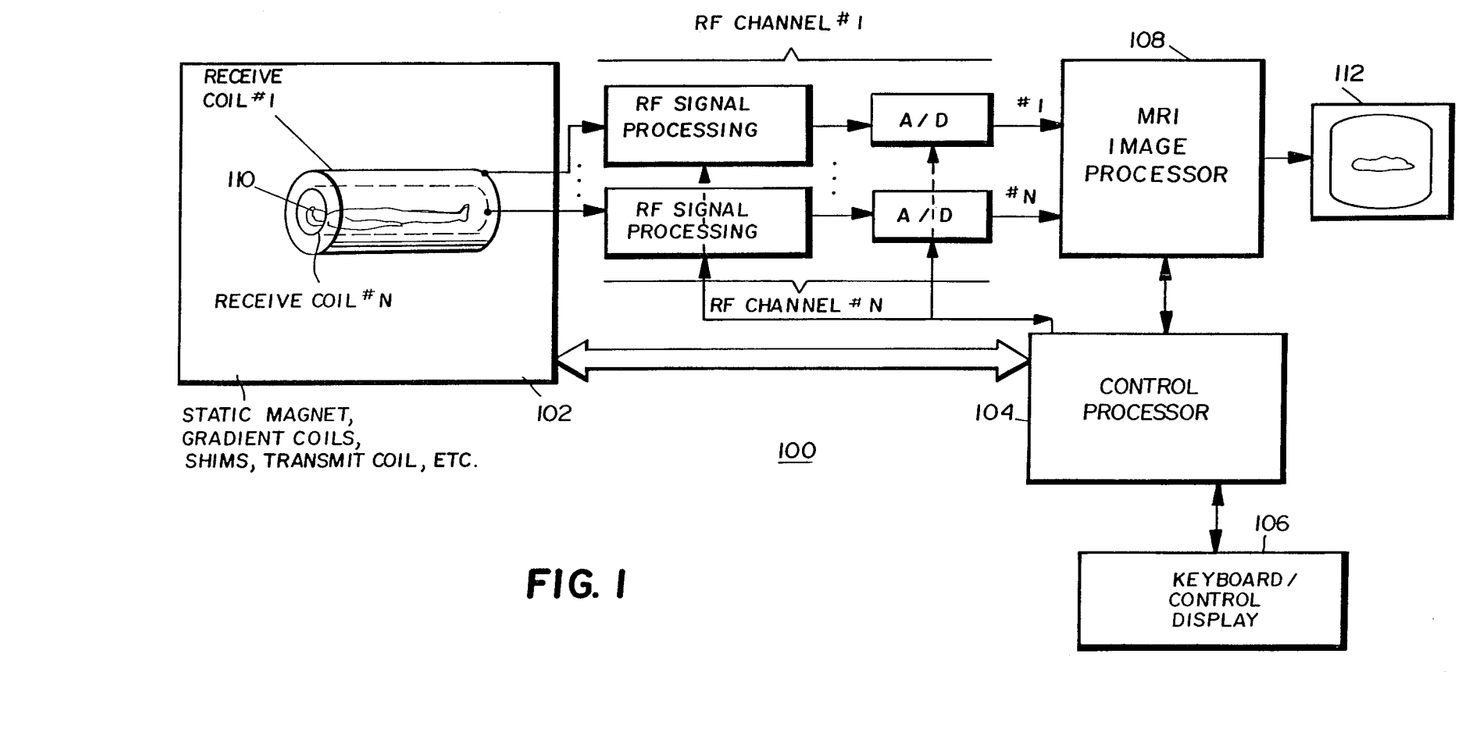
FIG. 1 is an abbreviated schematic block diagram of an MRI system employing this invention.

In FIG. 1 an MRI system 100 is schematically depicted as including the usual static magnet, gradient coils, shim coils, transmit RF coils, 102 under control of processor 104 (which typically communicates with an operator via a conventional keyboard/control display module 106). Although, it is conceivable that a single processor might both control the system and also carry out the actual MRI imaging processes, it is perhaps more conventional to employ a system of multiple processors for carrying out specialized functions within the MRI system 100 as will be appreciated. Accordingly, as depicted in FIG. 1, an MRI image processor 108 receives digitized data representing RF NMR responses from an object under examination (e.g., a human body 110) and, typically via multiple Fourier transformation processes well-known in the art, calculates a digitized visual image (e.g., a two-dimensional array of picture elements or pixels, each of which may have different gradations of gray values or color values, or the like) which may then be conventionally displayed at 112.

In accordance with this invention, a plurality of receive coils 1 ... N are independently coupled to a common imaging volume (e.g., a desired portion of body 110). The RF signals emanating from these coils are respectively processed in independent RF channels 1 through N. As depicted in FIG. 1, each such RF channel may comprise a considerable amount of conventional analog RF signal processing circuits as well as an eventual analog to digital conversion before being input to the MRI processor 108 (which may typically include means for digitally storing the acquired data during a data acquisition sequence until the image processor 108 uses such acquired data to produce an image at 112).

Although the RF channel circuitry may typically include a rather complex (and expensive) amount of circuitry, it is not believed necessary to describe it in any detail since conventional RF signal processing circuitry per se may be employed with this invention. However, the extra expense of using extra receive coils and associated RF signal processing channels does have to be balanced against the improvement in data capturing time when considering the overall economics of this approach.

Accordingly, to practice this invention, modifications need be made in essentially only three areas of a conventional MRI processing system:

1. additional receive coils need to be employed and their construction is preferably such that they are substantially independent (i.e., effectively without substantial mutual inductive coupling or capacitive coupling);
2. an additional RF signal processing channel needs to be added for each of the additonal receive coils; and
3. the MRI reconstruction algorithm programmed into and implemented by the image processor 108 needs to be slightly modified so as to use the additional incoming data to calculate multiply phase-encoded MRI data in an appropriate way.

Since the RF signal processing channels are, per se, simply replications of existing conventional RF channels, it is not believed that any further detailed description of such additional channels need be given in this application. Rather, the following disclosure will concentrate on practical exemplary embodiments for the receive coil and for the new calculations to be made in the image processor 108.

Present reconstruction techniques in two dimensional NMR imaging are highly efficient in two of the three dimensions. One limitation is the large number of phase-encoded echoes which must be acquired in order to reconstruct a full image. In an attempt to facilitate the development of very fast NMR imaging techniques, it is useful to consider reconstruction techniques which do not rely on multiple acquisitions of phase-encoded spin echo signals.

One approach for reducing the number of phase-encoded spin echoes required for a reconstruction of an image is described below. It uses multiple coils for the acquisition of signals, then uses the resulting additional information to speed the reconstruction process. The reconstruction algorithm is, initially, in the following discussion, based on an idealized NMR detector. Thus, theoretically, one can conceive a situation in which it may be possible to reconstruct an entire image from but a single NMR spin echo! However, as one might expect, realities of signal-to-noise make this a highly unrealistic situation. Nonetheless, the description is presented since it is the easiest way to initially demonstrate the algorithm. A more practical implementation of this algorithm is described later in which a set of two coil "building blocks" is used to reduce the number of required spin echoes by a factor of two.

Figure 2:
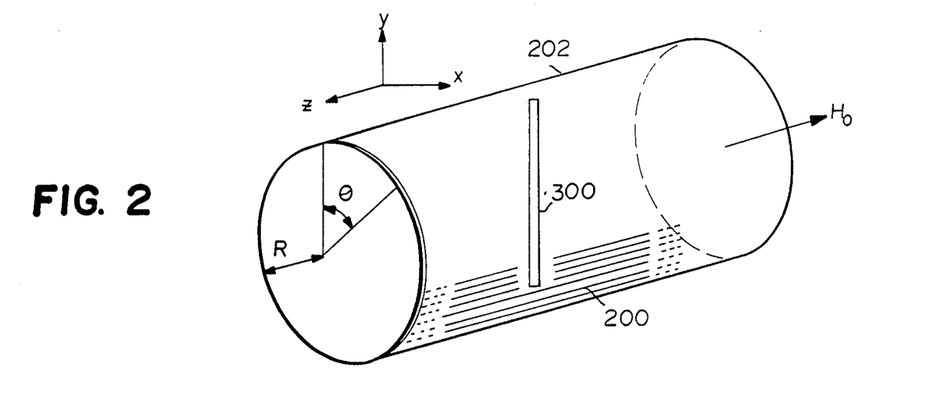
FIG. 2 is a schematic arrangement showing an arrangement of multiple RF receiver coils useful in explaining the underlying theory of this invention.

As an introduction to the technique, consider the idealized NMR detector in FIG. 2. Long, straight wires 200 (parallel to the static magnetic field $H_o$) run along the surface of a (non conductive) cylinder 202. The ends of these loops are closed at infinity. Only a few wires are shown. In the idealized coil, wires would densely surround the cylinder. Assume that the voltages on each of these loops induced by a precessing magnetic NMR dipole can be monitored separately. Denote the voltage induced on the loop whose wire is at an angle $\theta$ from the vertical by $V(\theta)$.

Figure 3:
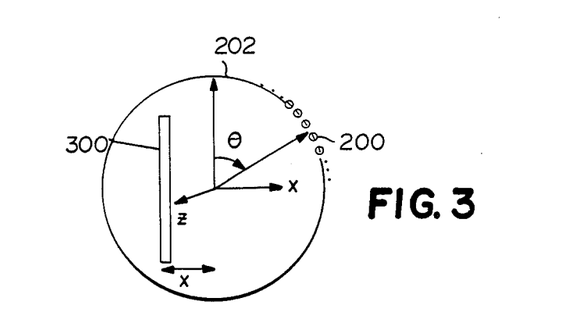
FIG. 3 is a schematic depiction of a cross-section of the multiple coil construction shown in FIG. 2.

Standard two dimensional reconstruction allows a straightforward procedure for localizing magnetization in two dimensions by means of slice selection and read-out gradients ($G_z$ and $G_x$, respectively). The time consuming processes are the number of required repetitions of the basic cycle to acquire the requisite phase-encoded data for resolving nuclei along the y-axis dimension. The problem at hand is to devise an algorithm to reconstruct a column 300 of magnetization perpendicular to the slice selection and read-out directions (e.g., along the y-axis). A schematic depiction of the situation is shown in FIG. 3. A column of magnetization 300 is centered at location x and z (z can be taken to be zero). Imagine that one is reconstructing an image of a column 300 as shown.

The voltage induced in the loop whose inner wire is located at angle $\theta$ is proportional to the magnetic field produced by that wire if it were a transmitter and driven with unit current. The magnetic field $B_x + iB_y$ at location (x,y) due to the wire at $\theta$ is:

$$B_x + iB_y = \frac{\mu_0}{4\pi} \frac{2i}{(x - iy) - R\sin\theta + iR\cos\theta} \quad \text{[Equation 1]}$$

The voltage induced on the wire at $\theta$ can then be written as a superposition of the voltages induced by all magnetization:

$$V(\theta) = \int m(x,y) \frac{1}{(x - iy) + i\alpha R} dy. \quad \text{[Equation 2]}$$

with $\alpha = e^{i\theta}$. Overall constants have been ignored.

This can easily be inverted with the contour integral $$\oint_{|\alpha|=1} V(\theta) e^{in\pi\alpha} d\alpha = \int m(x,y) \frac{e^{in\pi\alpha}}{(x - iy) + i\alpha R} d\alpha dy. \quad \text{[Equation 3]}$$

The integration contour is the unit circle. Since the integrand has a simple pole at $\alpha = i(x-iy)/R$ with residue $-ie^{-n\pi(x-iy)/R}/R$, the integral is easily performed. The answer is:

$$\int m(x,y) e^{in\pi y/R} dy = \frac{R}{2\pi} e^{n\pi x/R} \oint_{|\alpha|=1} V(\theta) e^{in\pi\alpha} d\alpha. \quad \text{[Equation 4]}$$

Since x is a known quantity, one can see that the result of the integration gives a value for the Fourier Transform of the magnetization density.

A crucial observation is that a complete determination of $V(\theta)$ together with the evaluation of this integral yields all values of the Fourier Transform of the magnetization density. However, if the magnetization has experienced a phase-encoding gradient previously in the sequence with a strength $G_y$ and duration $\tau$, then the magnetization density along a column is $$m(x,y)e^{i\gamma G_y Y\tau}. \quad \text{[Equation 5]}$$

In this case, evaluation of the integral yields values of the Fourier Transform at different values in k space.

One difficulty in evaluating the integral in the reconstruction arises from the exponential term in the integrand:

$$e^{in\pi e u\theta}. \quad \text{[Equation 6]}$$

When $\theta = -\tau/2$, the exponential term is $e^{+n\pi}$. For n larger than 3 or 4, the size of this peak makes an accurate evaluation of the integral difficult.

One way to circumvent the difficulties in the numerical integration is to presume in the idealized NMR receiver that one is able to measure the Fourier Transform of $V(\theta)$. That is, what is measured are the coefficients $\alpha_k$ from the Fourier expansion of the voltage:

$$V(\theta) = \sum_{k=-\infty}^{\infty} \alpha_k e^{ik\theta}. \quad \text{[Equation 7]}$$

Substituting this expression into the reconstruction integral:

$$V(\theta)e^{in\pi\alpha}d\alpha = \sum_k \alpha_k \int \alpha^k e^{in\pi\alpha}d\alpha. \quad \text{[Equation 8]}$$

The integral over $\alpha$ vanishes unless k is negative. This result gives the answer:

$$2\pi i \sum_{k=-28}^{-1} \alpha_k \frac{(in\pi)^{-1-k}}{(-1-k)!}. \quad \text{[Equation 9]}$$

In other words, by measuring the negative Fourier coefficients of the voltage induced in the wires and performing a sum one may calculate values of the Fourier Transform of the magnetization density.

Now it is time to discuss a more realistic implementation. In an actual embodiment, it is likely that multiple receiver coils would be used to gather sufficient data to reconstruct two (or possibly three or more) values of the Fourier Transform of the magnetization density. Standard phase-encoding pulses would still be needed in order to gather all projections. Consider the relatively simple coil of four wires. The first negative Fourier coefficient of the voltages is given by:

$$\alpha_{-1} = \frac{1}{8\pi}[V(\theta=0) + iV(\pi/2) - V(\pi) - iV(3\pi/2)] \quad \text{[Equation 10]}$$

$$= \frac{1}{8\pi}[V(0) - V(\pi) + i(V(\pi/2) - V(3\pi/2))]. \quad \text{[Equation 11]}$$

The expression has been rewritten to make explicit the following fact: the term $V(O) - V(\pi)$ is nothing but the voltage induced in a loop that has one wire along the cylinder at $\theta = 0$ and a return path along the bottom of the cylinder at $\theta = \pi$. So also, the other two terms in the voltage Fourier coefficient are the same as the voltage induced in the horizontal loop.

Figure 4:
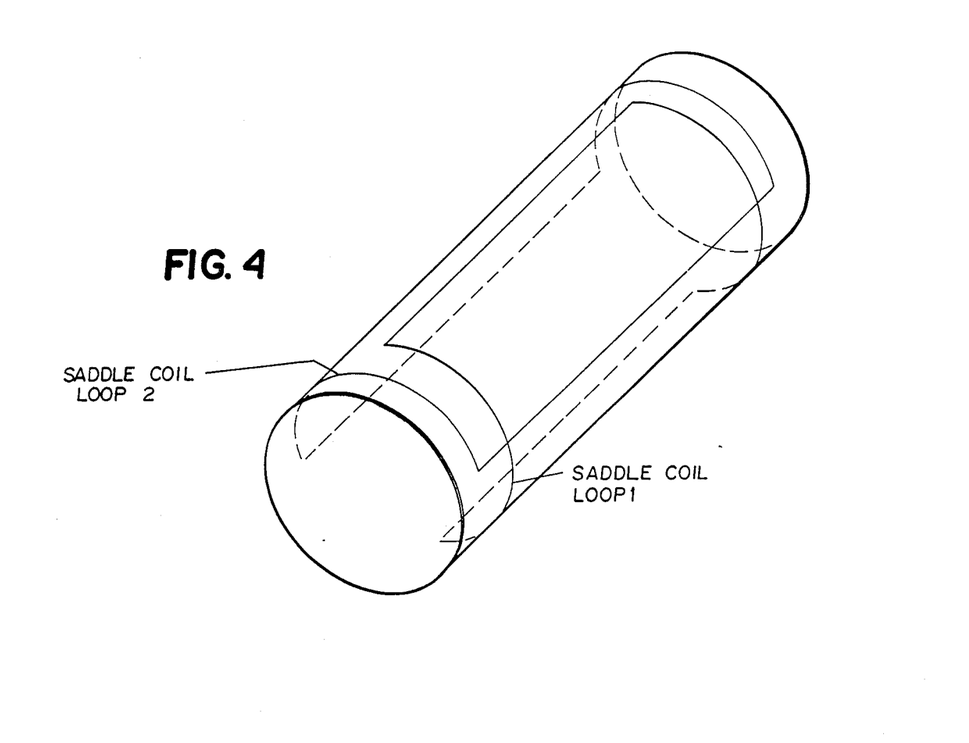
FIG. 4 is a schematic view of one possible practical embodiment of two co-located saddle coils for implementing the simplest multiple coil case where N=1.

This observation yields an actual practical implementation. The basic "building block" coil is a two loop arrangement of FIG. 4. From this, the voltage Fourier coefficient $\alpha_{-1}$ is given by the voltage induced in the vertical saddle coil loop 1 combined with the voltage in the horizontal saddle coil loop 2 shifted by 90 degrees. This can be viewed as a simple quadrature receiver. In fact, it can be implemented as a four legged birdcage coil receiving in quadrature.

The next question is whether one may measure additional Fourier coefficients from this four wire situation. The answer is no. Given only four wires, the next negative Fourier coefficient, $\alpha_{-2}$, is indistinguishable from the Fourier coefficient $\alpha_2$. In order to measure higher Fourier coefficients one must have additional loops.

A straightforward way to do this is to use an eight wire configuration. One may construct the voltage Fourier coefficients $\alpha_{-1}$ and $\alpha_{-2}$ from the signals induced in each wire on the cylinder. That is, $$\alpha_{-1} = \frac{1}{16\pi}[V(0) + e^{+i\pi/4}V(\pi/4) + iV(\pi/2) + \quad \text{[Equation 12]}$$

$$e^{+i3\pi/4}V(3\pi/4) - V(\pi) + e^{+i5\pi/4}V(5\pi/4) - iV(3\pi/2) +$$

$$e^{+7\pi/4}V(7\pi/4)]$$

$$= \frac{1}{16\pi}[\{V(0) - V(\pi) + i(V(\pi/2) - \quad \text{[Equation 13]}$$

$$V(3\pi/2))\} + e^{+i\pi/4}\{V(\pi/4) - V(5\pi/4) + i(V(3\pi/4) -$$

$$V(7\pi/4))\}].$$

This can be recognized as the signal in a building block coil combined with the 45 degree phase shift of the signal on the second building block coil. Again, one implementation can use a birdcage coil receiving in quadrature. This time the receiver is an eight legged cage.

The voltage Fourier coefficient $\alpha_{-2}$ is written in a similar form:

$$\alpha_{-2} = \frac{1}{16\pi}[\{V(0) - V(\pi/2) + V(\pi) - \quad \text{[Equation 14]}$$

$$V(3\pi/2)\} + i\{V(\pi/4) - V(3\pi/4) + V(5\pi/4) - V(7\pi/4)\}].$$

This is not a simple superposition of signals from building block coils. Instead, it is the signal of two opposed saddle coils receiving in quadrature. One way to realize this coil is to construct a quadrature eight legged birdcage coil tuned to its second harmonic resonant frequency. Of course, the coil must be distinct from the first in order for its second resonant frequency to coincide with the first resonant frequency of the first.

Higher order situations are similarly constructed.

Two major questions remain concerning this technique: (1) what is the signal to noise cost in the image and (2) how can one construct coils which behave as independent receivers. Simulations of data reconstruction have been performed using eight wire coils to reduce the number of phase-encoding acquisitions by a factor of two. The response to noise generated by the sample—and hence correlated in the coils—presently appears to be identical in this reconstruction and in standard two dimensional imaging. A serious concern is that reconstruction is impossible if noise generated by the coils is sufficiently high.

Coil coupling is another concern. Only if the coils can be substantially decoupled can the reconstruction proceed in the manner described previously. The implementation using two birdcage coils offers a possibility of solving the coupling problem since two birdcage coils operating in different modes (but the same frequency) have no intrinsic mutual inductance between coils. And capacitive coupling may be minimized (e.g., using techniques employed for realizing practical quadrature detection coils, per se).

As will be appreciated by those in the art, practical coil constructions for RF receiving in MRI typically include tuning and impedance matching capacitances in conjunction with transmission lines, etc. For purposes of simplifying the discussion in this case, such conventional aspects of RF receiving coils and their associated RF transmission lines, etc., are not depicted in the FIGURES or otherwise described.

Another way to understand the underlying theory, is to imagine a simplified imaging experiment which attempts to reconstruct the transverse magnetization density in a sample tube that is parallel to the y axis. The x and z location of the column are known. What is needed, is a reconstruction of the sample along the y direction. This simplified experiment can be viewed as merely part of a standard two-dimensional Fourier Transformation MRI imaging sequence. A slice/selective RF excitation provides a section of sample with a known value of z and the read-out gradient $G_x$ provides frequency encoding in the x-direction. Thus, after Fourier Transformation of the acquired data, the Fourier content of the data in a standard two-dimensional Fourier transform acquisition provides the sum of the transverse magnetization in the hypothetical column or sample now being considered.

Standard two-dimensional FT imaging uses repeated acquisitions with phase-encoded echoes to generate the Fourier transform of the transverse magnetization along the y direction. If the field of view along the y direction is taken to be L, the Fourier transform is usually written as $$m(n) = \int m(y) e^{2\pi i n y / NL} dy \quad \text{[Equation 15]}$$

and $m = m_x + i m_y$ is the complex transverse magnetization.

For the purposes of illustration, consider the idealized RF receiver coil (FIG. 2) for this experiment. The receiver consists of a collection of long wires parallel to the static field and laid on the surface of a cylinder. The loops are closed by return paths at infinity. In this idealized receiver coil one may measure the echo signal by monitoring the voltage induced in each wire. Denote the voltage in the wire at position $\theta$ by $V(\theta)$. As shown above, the Fourier transform of the magnetization density is expressible in terms of the Fourier transform of the induced voltages. Let $V(n)$ be the Fourier coefficient of the voltage, then the expressions for the Fourier transform of the magnetization take the form:

$$m(0) = \int m(y) dy = iRV(-1) \quad \text{[Equation 16]}$$

$$m(+1) = \int m(y) e^{i\pi y/R} dy = iRe^{\pi x/R}[V(-1) + i\pi V(-2) - \frac{\pi^2}{2} V(-3) + \ldots]$$

$$m(+2) = \int m(y) e^{2i\pi y/R} dy = iRe^{2\pi x/R}[V(-1) + 2i\pi V(-2) - 2\pi^2 V(-3) + \ldots]$$

$$m(-1) = \int m(y) e^{-i\pi y/R} dy = iRe^{-\pi x/R}[V(-1) - i\pi V(-2) - \frac{\pi^2}{2} V(-3) + \ldots]$$

$$m(-2) = \int m(y) e^{-2i\pi y/R} dy = iRe^{-2\pi x/R}[V(-1) - 2i\pi V(-2) - 2\pi^2 V(-3) + \ldots]$$

where R is the radius of the coil; the field of view, L, is 2R.

Only the five lowest Fourier coefficients are shown. In principle, given sufficiently many voltage Fourier coefficients, one may construct all terms in the Fourier transform of the magnetization density. Thus, one can reconstruct the entire column of the sample within one spin echo response.

There are two important practical considerations that rule out the possibility of a complete reconstruction from one echo, however. One problem is coil coupling. An actual coil of separate loops surrounding a cylinder would not behave exactly as described. One reason is that coils in receivers are tuned circuits and voltages produced by echoes induce currents. Since the idealized receiver coil has a collection of loops with large mutual inductance between loops, the signal in each loop is not that just produced by the echo. The crucial observation—and this is key to feasibility—is that even though one cannot build the idealized coil, one can build separate coils that directly measure the voltage Fourier coefficients where there is substantially no intrinsic mutual inductance between these coils.

One embodiment of a multiple coil set is a pair of birdcage resonators. Previously, these coils have been developed as a means of producing a homogeneous RF field. Homogeneity is due to the current distribution on the legs of a driven birdcage that varies as $\cos \theta$. One can use the birdcage as a quadrature transmitter and generate a complex current distribution $\exp(-i\theta)$. In this situation, a driving voltage produces a voltage distribution across the legs of the birdcage that varies as $\exp(-i\theta)$.

By using the standard reciprocity principle, we can see how to produce a coil to measure $V(-1)$. Since the voltage distributions are the same in transmission and reception, a standard birdcage resonator produces a net output voltage proportional to the sum of voltages induced on each leg weighted by $\exp(-i\theta)$.

A coil that measures $V(-2)$ requires a birdcage coil with a current distribution that varies as $\cos 2\theta$. By extending the previous results one can see that this coil measures a sum of voltages induced on each let with a weighting factor of $\exp(-2i\theta)$. One method of producing a $\cos 2\theta$ distribution is to construct a birdcage coil and tune it to its second resonant frequency. Normally, a birdcage coil has many resonant frequencies, each of which is approximately a multiple of the lowest fundamental frequency. What one here requires is one coil whose fundamental frequency coincides with the NMR frequency (e.g., 15 MHz) and a separate coil whose second harmonic is at the same frequency.

The two coils may be placed concentrically around the sample with substantially no intrinsic mutual inductance. Since there is substantially no intrinsic coupling between the coils, each coil behaves independent of the other and the net signal on each output is the proper voltage Fourier coefficient. One still has to contend with capacitive coupling between the coils, as well as residual inductive coupling. However, careful adjustment of the relative alignment of the two coils and other now standard techniques for decoupling quadrature-connected receive coils should provide adequate isolation.

Birdcage resonators are not the only way to construct these coils. Some other configurations are shown in FIGS. 5a–5d. Note that quadrature as well as non-quadrature coils may be constructed. Non-quadrature coils will be much easier to construct, but the lower signal to noise ratio of these coils may degrade the image substantially.

Figure 5A:
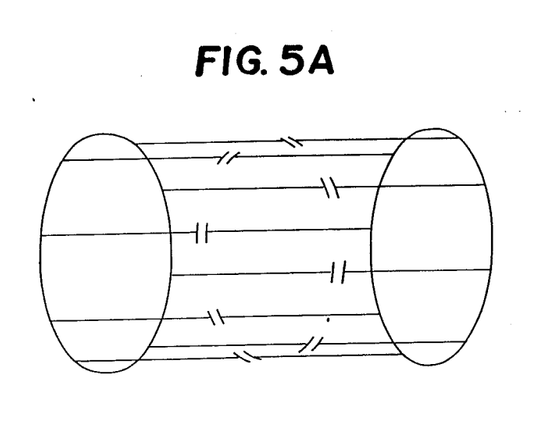
FIGS. 5A 5B, 5C, and 5D are further schematic depictions of various birdcage and saddle coil constructions that might be utilized for achieving a practical RF receive coil for use with this invention.
Figure 5B:
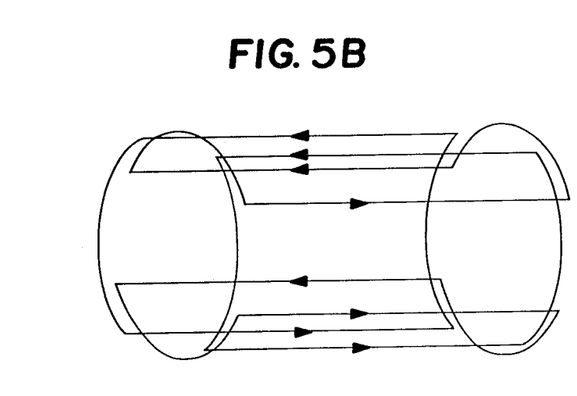
Figure 5C:
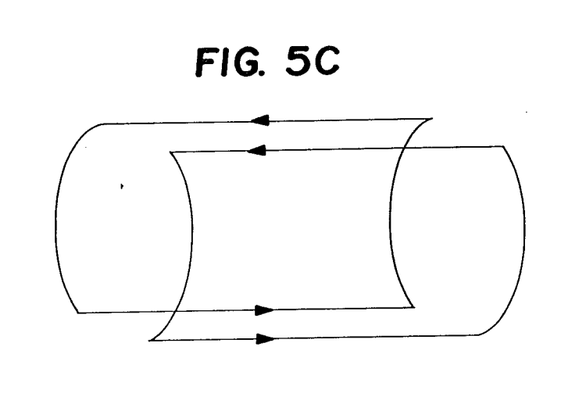
Figure 5D:
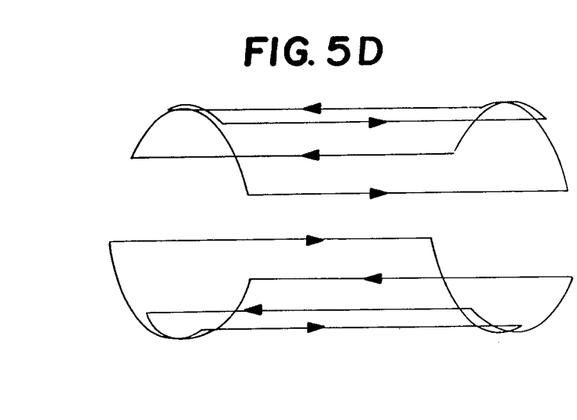

FIG. 5a depicts a "low pass" birdcage. FIG. 5b depicts a homogeneous quadrature saddle coil. Arrows denote the direction of current flow. Since the coil has a homogeneous reception pattern, the signal is essentially the same (albeit with higher signal to noise ratio) as a non-quadrature saddle coil (FIG. 5c). Another design for a coil to measure $V(-2)$ is shown in FIG. 5d.

The second practical consideration facing complete reconstruction from one echo is the signal-to-noise ratio. One expects that the signal to noise ratio of human MRI is insufficient to allow for single echo reconstruction. Therefore, one may concentrate on a reduced implementation. For example, only two voltage Fourier coefficients will be measured in the present exemplary embodiments: $V(-1)$ and $V(-2)$. Given these, one can construct three Fourier coefficients of the magnetization by truncating the sums for the expression of m(n):

$$m(-1) = iRe^{-\pi x/R}[V(-1) - i\pi V(-2)]$$

$$m(0) = iRV(-1)$$

$$m(+1) = iRe^{\pi x/R}[V(-1) + i\pi V(-2)]$$

[Equation 17]

An actual imaging sequence will be a hybrid technique of reconstruction using standard phase-encoding in the y direction and using the extra spatial information generated by the two voltage signals. That is, a typical data acquisition sequence may first acquire an echo with no phase encoding. From this, one can construct $m(-1)$, $m(0)$ and $m(1)$. Next, a sequence will acquire an echo with a phase-encoding factor of $\exp(2i\pi y/R)$. From this, one can construct the terms $m(1)$, $m(2)$ and $m(3)$. This is repeated for the rest of the positive and all negative phase encodings:

$$M(3) = [m_b(3) + m_c(3)]/2$$
$$M(4) = m_c(4)$$

.
.
.

$$M(-1) = [m_a(-1) + m_q(-1)]/2$$
$$M(-2) = m_q(-2)$$
$$M(-3) = [m_q(-3) + m_r(-3)]/2$$
$$M(-4) = m_r(-4)$$

.
.
.

The net result is that one only requires one-half of the usual number of echoes in order to fully reconstruct the image. Notice that one acquires the even projections (m(0), m(2), m(4), and so on) entirely conventionally from the signal $V(-1)$ from coil #1. The odd projections then are calculated from both $V(-1)$ and $V(-2)$. The odd projections are calculated twice and averaged in the presently preferred embodiment. This provides a more artifact free reconstruction. Examples of one dimensional reconstructions are discussed below.

Notice that the coil to measure $V(-1)$ is a uniform receiver coil and resembles standard designs in imaging and spectroscopy. For present purposes, this will be referred to as the "primary" channel. The coil to measure $V(-2)$ is highly non-uniform. This will be referred to as the "secondary" channel.

The signal-to-noise ratio of multi (e.g., two) channel reconstruction deserves special treatment. Since, for the case $N=2$, one has a system of two receivers, the noise in a reconstructed image depends on whether the noise in the two channels is correlated or uncorrelated. If the coils themselves generate the noise, then the noise is uncorrelated in the two channels. Noise generated by the sample produces a noise voltage which is received by both coils and is therefore correlated. (Notice that the noise is correlated but not necessarily in phase in both channels. The relative phase of the noise voltage depends on the location of the noise generating sample.)

Consider a specific example. A point sample is placed at the center of the coil. In this simplified arrangement, the magnetization produced by the sample will not generate any signal in the secondary channel. So also, any noise generated by the sample will not be received by this channel. The primary channel, will receive both signal and noise generated by the sample. A quick calculation of the noise in an image with standard phase-encoded imaging and multiple receiver coil imaging shows:

TABLE I

| Data Gathering sub-cycle | | | | encoded magnetization values captured | | | | | | |
|---|---|---|---|---|---|---|---|---|---|---|
| a | | | | | $m_a(-1)$ | $m_a(0)$ | $m_a(1)$ | | | |
| b | | | | | ↓ | ↓ | $m_b(1)$ | $m_b(2)$ | $m_b(3)$ | |
| c | | | | | ↓ | ↓ | ↓ | ↓ | $m_c(3)$ | $m_c(4)$ | $m_c(5)$ |
| . | | | | | ↓ | ↓ | ↓ | ↓ | ↓ | ↓ |
| . | | | | | ↓ | ↓ | ↓ | ↓ | ↓ | ↓ |
| . | | | | | ↓ | ↓ | ↓ | ↓ | ↓ | ↓ |
| q | | | $m_q(-3)$ | $m_q(-2)$ | $m_q(-1)$ | ↓ | ↓ | ↓ | ↓ | ↓ |
| r | $m_r(-5)$ | $m_r(-4)$ | $m_r(-3)$ | ↓ | ↓ | ↓ | ↓ | ↓ | ↓ | ↓ |
| | ↓ | ↓ | ↓ | ↓ | ↓ | ↓ | ↓ | ↓ | ↓ | ↓ |
| | M(-4) | M(-3) | M(-2) | M(-1) | M(0) | m(1) | M(2) | M(3) | M(4) |

Where: M = Fourier coefficients along y-axis dimension
$M(0) = m_a(0)$
$M(1) = [m_a(1) + m_b(1)]/2$
$M(2) = m_b(2)$ shows:

$$\frac{(\text{Noise})_{Multiple\ Coil}}{(\text{Noise})_{Standard}} = \sqrt{2}\ \cos^2\ \pi y/L \qquad \text{[Equation 18]}$$

The noise at the center of the image increased by $\sqrt{2}$. This is just a consequence of the multiple coil acquisition acquiring one-half the data. Therefore, multiple coil acquisition has the same signal-to-noise ratio per unit time as standard imaging in this example.

Away from the center of the image, noise actually decreases as compared to standard imaging. Since the noise is correlated in the frequency domain, the Fourier transform of the data (i.e., the image) shows structured noise.

This analysis changes if the noise is completely generated by the coils. Using the same example as before, the secondary channel will have a noise voltage even though there is no sample generated signal. Following in the standard noise analysis, the ratio of the noise in two imaging procedures is:

$$\frac{(\text{Noise})_{Multiple\ Coil}}{(\text{Noise})_{Standard}} = \qquad \text{[Equation 19]}$$

$$\sqrt{2\cos^4\ \pi y/L + \frac{\pi^2}{2} \sin^2\ 2\pi y/L}$$

The noise has again increased by a factor of $\sqrt{2}$ at the center. And, unlike the previous example, noise never decreases compared to standard imaging.

MRI of biological tissue in mid to high field strengths is in the regime of sample generated noise. There may be a loss in signal to noise ratio. This procedure is applicable to sequences well above the signal to noise ratio threshold where speed is the issue.

The expressions for the Fourier transform of the magnetization density, m(n), involve infinite sums of voltage Fourier coefficients, V(n). In practice, as proposed above, one only measures signal from a finite number of coils (e.g., two coils). The effects of truncating the infinite sum at only two terms, for example, is considered below.

Also, given signal from only two receiver coils, some Fourier projections of the magnetization density can be calculated more reliably than others. That is, the previous section contains the expressions for m(−1), m(0) and m(1) and V(−2). For the most artifact free reconstruction, calculating all three m(n)'s from one echo (resulting in a 67% time reduction), calculating two m(n)'s from one echo, or calculating three m(n)'s from one echo but redundantly calculating every other m(n) and averaging the results will provide different quality MRI images.

Considering these effects for quadrature birdcage coil receivers, in a typical imaging scenario, the acquired time domain signal is Fourier Transformed to yield terms in the Fourier Transform along the y direction for a given x. The remaining problem is a one-dimensional reconstruction of density along the y direction.

Figure 6:
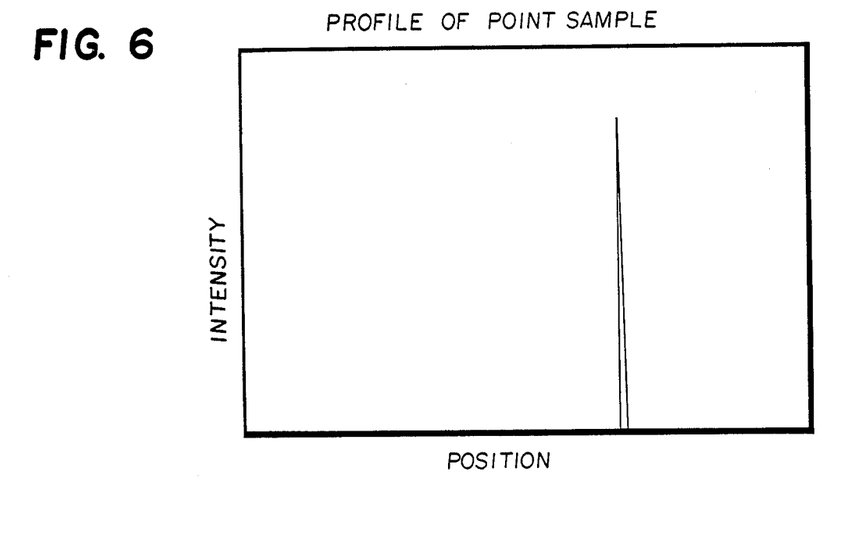
FIG. 6 is a graph showing spin density of a simple one-dimensional sample.
Figure 7:
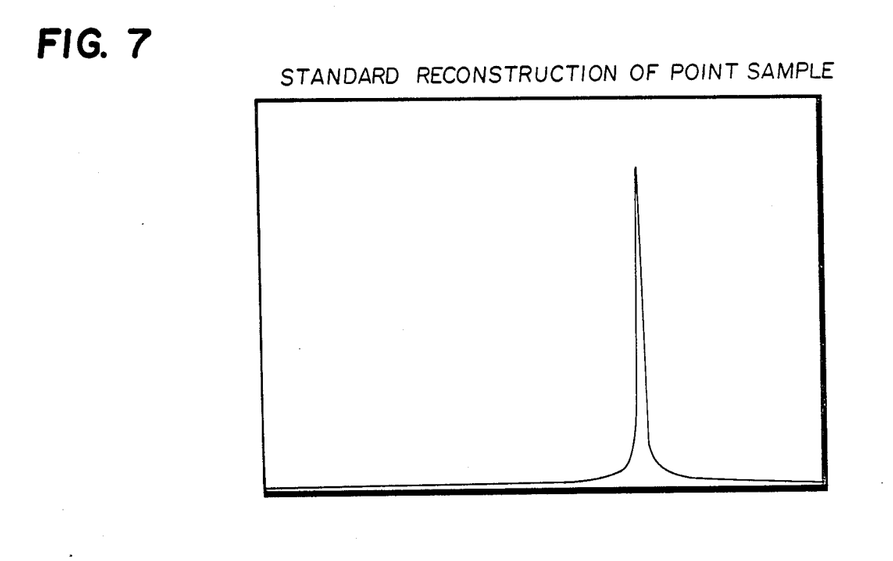
FIG. 7 is a graph depicting standard Fourier reconstruction of the samples shown in FIG. 6.

The profile of such a simple point sample is shown in FIG. 6. Here, signal only arises from a small sample located off center. A standard 128 projection reconstruction with a single receiver coil is shown in FIG. 7. This displays the magnitude of the reconstructed profile; the point spread is the usual behavior of a finitely sampled Fourier transform.

Figure 8:
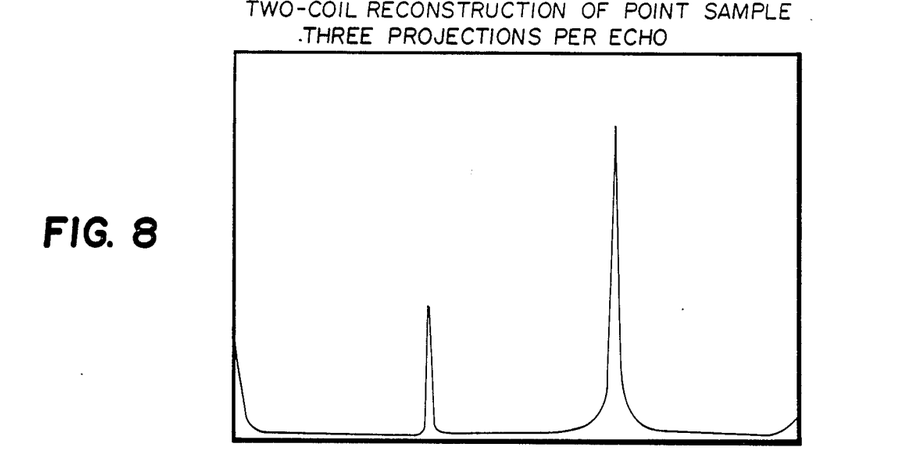
FIG. 8 depicts a two-coil reconstruction of a point sample using three projections per echo.
Figure 9:
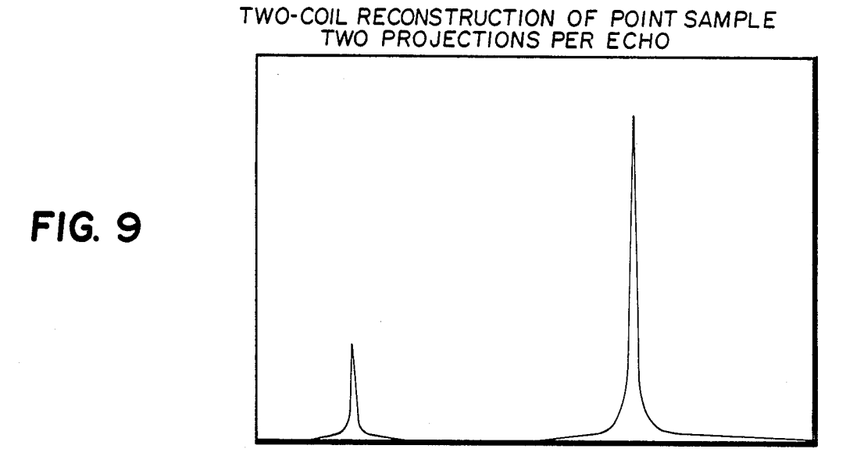
FIG. 9 depicts a two-coil reconstruction of a point sample using two projections per echo.

FIG. 8 shows the magnitude of a reconstruction using two receivers and calculating three Fourier projections per echo. The artifact in the reconstruction is quite large. A less ambitious approach of calculating two Fourier projections per echo (FIG. 9) with a 50% time savings decreases the artifact but it is still large.

Figure 10:
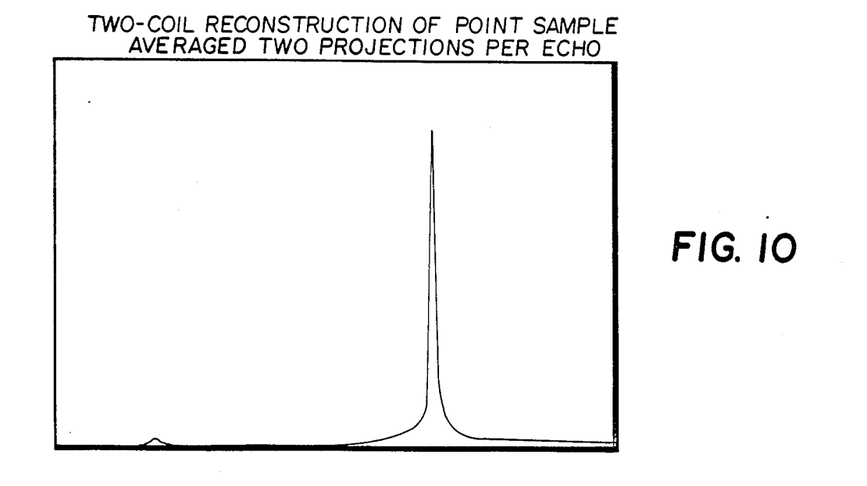
FIG. 10 depicts a two-coil reconstruction of a point sample using an averaged value of two projections per echo.

The best results so far are obtained with a redundant calculation of three projections per echo; every other echo is calculated twice and averaged (as noted above in Table I). A magnitude reconstruction with this approach is shown in FIG. 10. The level of artifact is significantly reduced. The height of the false peak is roughly 2% of the height of the sample peak. The 50% time savings is preserved.

Figure 11:
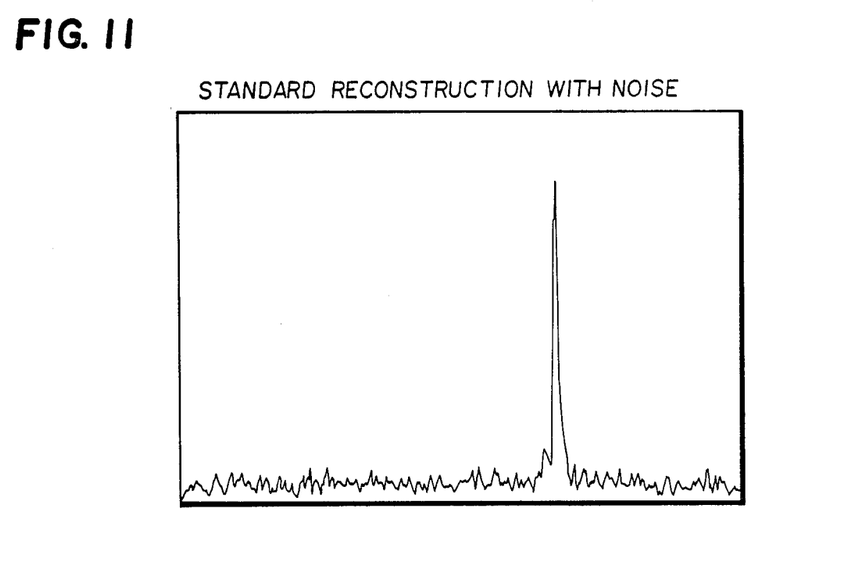
FIG. 11 depicts a standard Fourier reconstruction of the same sample with Gaussian white noise added to the sample signal.
Figure 12:
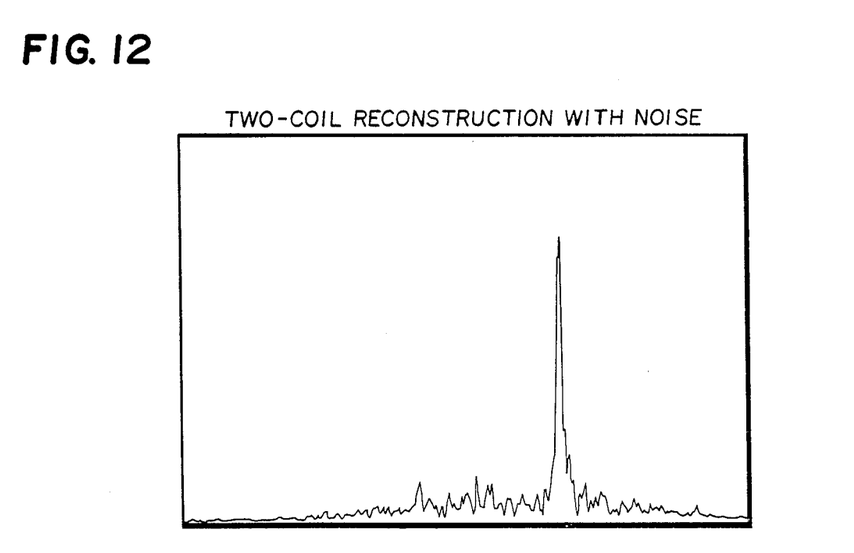
FIG. 12 depicts a two-coil reconstruction of the same sample with sample generated noise.

FIG. 11 shows a standard reconstruction of a point sample with sample generated noise. An image acquired in half the time using two receivers shows an increase in noise as shown in FIG. 12. As expected, the noise level has increased by $\sqrt{2}$. Towards the edge of the field of view noise decreases.

While only a few exemplary embodiments have been described in detail above, those skilled in the art will recognize that many variations and modifications may be made in these exemplary embodiments while yet retaining many of the novel features and advantages of this invention. All such variations and modifications are intended to be encompassed by the scope of the appended claims.

What is claimed is:

1. A method for rapidly capturing MRI data, said method comprising the steps of:
   (i) receiving and recording NMR RF responses in plural substantially independent RF signal receiving and processing channels during the occurrence of at least one NMR RF response; and
   (ii) processing plural data sets respectively provided by said plural RF channels to produce multiply phase-encoded MRI data from said at least one NMR RF response.

2. A method as in claim 1 wherein said at least one NMR RF response is a single NMR spin echo response.

3. A magnetic resonance imaging method for materially reducing the number of repetitive NMR phase-encoded data gathering processes which must be performed to produce a multi-dimensional Fourier Transform image, said method comprising the steps of:
   (i) recording NMR RF responses via a first receiving coil and RF signal processing channel to obtain first MRI data;
   (ii) simultaneously recording said NMR RF responses via at least one further RF receiving coil and RF signal processing channel to obtain second MRI data;
   (iii) processing said first and second MRI data to provide Fourier Transform MRI data representative of at least two different degrees of NMR phase-encoding and reducing by at least about one-half the time required for gathering NMR data sufficient to produce said multi-dimenisonal Fourier Transform image.

4. A method for magnetic resonance imaging the internal structure of an object to produce an image having resolution MxN pixels in x and y dimensions within a planar volume of substantially fixed z dimensions, MRI data for said image being captured using NMR RF responses of nuclei subjected to a static magnetic field with a sequence of mutually orthogonal x,y,z magnetic gradient pulses and NMR RF excitation pulses superimposed thereon, said method comprising the steps of:
(i) selectively exciting a planar volume of NMR nuclei of substantially fixed z dimension using a z-axis oriented magnetic gradient;
(ii) phase-encoding nuclei in a y-axis dimension using a subsequent pulse of y-axis oriented mangetic gradient;
(iii) in the presence of an x-axis oriented magnetic gradient,
(a) recording a resultant NMR RF response from a said nuclei via a first RF receiving coil and RF signal processing channel to obtain first MRI data, and
(b) simultaneously also recording said resultant NMR RF response from said nuclei via at least a second RF receiving coil and RF signal processing channel to obtain second MRI data;
(iv) processing said first and second MRI data to provide further MRI data representative of at least two different degrees of y-axis phase encoding;
(v) repeating steps (i)–(iv) substantially less than N times, using different degrees of y-axis magnetic gradient, to provide a complete MRI data set capable of producing an MRI image having N pixel resolution along the y-axis dimension.

5. A method as in claim 4 wherein:
steps (i)–(iv) are repeated approximately N/2 times.

6. A method as in claim 4 or 5 wherein:
step (iv) provides further MRI data representative of at least three different degrees of y-axis phase encoding;
step (v) uses y-axis magnetic gradients which, on different repeat cycles, provide at least two sets of said further MRI data representing the same degree of y-axis phase encoding; and
step (v) also includes the step of averaging together said further MRI data representing the same degree of y-axis phase encoding.

7. a method as in claim 6 wherein step (iv) comprises:
(a) obtaining the first Fourier Transform coefficient V(1) of the first MRI data;
(b) obtaining the first Fourier Transform coefficient V(2) of the second MRI data;
(c) calculating three Fourier coefficients m(−1), m(0) and m(+1) of NMR magnetization for respectively corresponding different degrees of y-axis phase-encoding using the formulae:

$$m(-1) = iR\exp(-\pi x/R)[V(1) - i\pi V(2)]$$

$$m(0) = iRV(1)$$

$$m(+1) = iR\exp(\pi x/R)[V(1) + i\pi V(2)]$$

where

R = the effective radius of the RF receiving coils, and
x = the x coordinate for which a column of y-axis phase-encoded nuclei is being analyzed.

8. A method as in claim 7 wherein the m(−1) result for one repeat of steps (i)–(iv) is averaged with the m(+1) result for another repeat of steps (i)–(iv).

9. A magnetic resonance imaging system for imaging internal structure of an object using NMR RF responses of nuclei subjected to a static magnetic field and having a sequence of magnetic gradients and RF NMR excitation pulses superimposed thereon, said system comprising:
a first RF coil coupled to a predetermined image volume for receiving said NMR RF responses with a first relationship between the spatial location of NMR nuclei and a resultive first RF signal output from said first RF coil;
a second RF coil also coupled to said image volume, for receiving said NMR RF responses with a second relationship between the spatial location of NMR nuclei and a resulting second RF signal output from said second RF coil;
said first and second RF coils being substantially independent and uncoupled to one another insofar as the NMR RF responses are concerned;
first and second independent RF signal processing channels connected respectively to individually receive and process said first and second RF signal outputs to produce independent first and second NMR response data from a single NMR RF response event; and
image processing means connected to receive said independent first and second NMR response data and to produce multiply phase-encoded NMR image data from said single NMR RF response event.

10. A magnetic resonance imaging system as in claim 9 wherein:
said first and second RF coils each comprise birdcage coils, said first RF coil being resonant at a first fundamental frequency of about F and said second RF coil being resonant at a second fundamental frequency of about F.

11. A magnetic resonance imaging system as in claim 9 wherein said first and second RF coils each comprise a pair of QD-connected saddle coils, said first RF coil being resonant at a first fundamental frequency of about F and said second RF coil being resonant at a second fundamental frequency of about F.

12. A magnetic resonance imaging system as in claim 9, 10, or 11 wherein:
said first RF coil provides a current/voltage distribution which varies as sin $\theta$ about said image volume; and
said second RF coil provides a current/voltage distribution which varies as sin $2\theta$ about said image volume.

13. Apparatus for rapidly capturing MRI data, said apparatus comprising:
(i) means for receiving and recording NMR RF responses in plural substantially independent RF signal receiving and processing channels during the occurrence of at least one NMR RF response; and
(ii) means for processing plural data sets respectively provided by said plural RF channels to produce multiply phase-encoded MRI data from said at least one NMR RF response.

14. Magnetic resonance imaging apparatus for materially reducing the number of repetitive NMR phase-encoded data gathering processes which must be performed to produce a multi-dimensional Fourier Transform image, said apparatus comprising: of:
(i) means for recording NMR RF responses via a first receiving coil and RF signal processing channel to obtain first MRI data;
(ii) means for simultaneously recording said NMR RF responses via at least one further RF receiving coil and RF signal processing channel to obtain second MRI data;

(iii) means for processing said first and second MRI data to provide Fourier Transform MRI data representative of at least two different degrees of NMR phase-encoding and reducing by at least about one-half the time required for gathering NMR data sufficient to produce said multi-dimensonal Fourier Transform image.

15. A apparatus for magnetic resonance imaging the internal structure of an object to produce an image having resolution MxN pixels in x and y dimensions within a planar volume of substantially fixed z dimensions, MRI data for said image being captured using NMR RF responses of nuclei subjected to a static magnetic field with a sequence of mutually orthogonal x,y,z magnetic gradient pulses and NMR RF excitation pulses superimposed thereon, said apparatus comprising:

(i) means for selectively exciting a planar volume of NMR nuclei of substantially fixed z dimension using a z-axis oriented magnetic gradient;

(ii) means for phase-encoding nuclei in a y-axis dimension using a subsequent pulse of y-axis oriented mangetic gradient;

(iii) means for, in the presence of an x-axis oriented magnetic gradient,
  (a) recording a resultant NMR RF response from a said nuclei via a first RF receiving coil and RF signal processing channel to obtain first MRI data, and
  (b) simultaneously also recording said resultant NMR RF response from said nuclei via at least a second RF receiving coil and RF signal processing channel to obtain second MRI data;

(iv) means for processing said first and second MRI data to provide further MRI data representative of at least two different degrees of y-axis phase encoding;

(v) means for repeating said exciting, phase-encoding and recording substantially less than N times, using different degrees of y-axis magnetic gradient, to provide a complete MRI data set capable of producing an MRI image having N pixel resolution along the y-axis dimension.

16. Apparatus as in claim 15 wherein:
said means for repeating causes approximately N/2 repetitions to occur.

17. A apparatus as in claim 15 or 16 wherein:
said means processing provides further MRI data representative of at least three different degrees of y-axis phase encoding;
said means for repeating uses y-axis magnetic gradients which, on different repeat cycles, provide at least two sets of said further MRI data representing the same degree of y-axis phase encoding; and
said means for repeating also includes means for averaging together said further MRI data representing the same degree of y-axis phase encoding.

18. Apparatus as in claim 17 wherein said means for processing comprises:
(a) means for obtaining the first Fourier Transform coefficient V(1) of the first MRI data;
(b) means for obtaining the first Fourier Transform coefficient V(2) of the second MRI data;
(c) means for calculating three Fourier coefficients m(−1), m(0) and m(+1) of NMR magnetization for respectively corresponding different degrees of y-axis phase-encoding using the formulae:

$$m(-1) = iRexp(-\pi x/R)[V(1) - i\pi V(2)]$$

$$m(0) = iRV(1)$$

$$m(+1) = iRexp(\pi x/R)[V(1) + i\pi V(2)]$$

where

R = the effective radius of the RF receiving coils, and
x = the x coordinate for which a column of y-axis phase-encoded nuclei is being analyzed.

19. Apparatus as in claim 18 wherein said means for averaging averages the m(−1) result for one repeat with the m(+1) result for another repeat.

20. A magnetic resonance imaging method for imaging internal structure of an object using NMR RF responses of nuclei subjected to a static magnetic field and having a sequence of magnetic gradients and RF NMR excitation pulses superimposed thereon, said method comprising:
receiving said NMR RF responses with a first relationship between the spatial location of NMR nuclei and a resultive first RF signal output from a first RF coil;
receiving said NMR RF responses with a second relationship between the spatial location of NMR nuclei and a resulting second RF signal output from a second RF coil;
said first and second RF coils being substantially independent and uncoupled to one another insofar as the NMR RF responses are concerned;
individually receiving and processing said first and second RF signal outputs to produce independent first and second NMR response data from a single NMR RF response event; and
receiving said independent first and second NMR response data and producing multiply phase-encoded NMR image data from said single NMR RF response event.

21. A magnetic resonance imaging method as in claim 20 wherein:
said first and second RF coils used in said receiving NMR RF responses steps respectively each comprise birdcage coils, said first RF coil being resonant at a first fundamental frequency of about F and said second RF coil being resonant at a second fundamental frequency of about F.

22. A magnetic resonance imaging method as in claim 20 wherein said first and second RF coils used in said receiving NMR RF response steps respectively each comprise a pair of QD-connected saddle coils, said first RF coil being resonant at a first fundamental frequency of about F and said second RF coil being resonant at a second fundamental frequency of about F.

23. A magnetic resonance imaging method as in claim 20, 21 or 22 wherein:
said first RF coil provides a current/voltage distribution which varies as $\sin \theta$ about said image volume; and
said second RF coil provides a current/voltage distribution which varies as $\sin 2\theta$ about said image volume.

* * * * *